US008170516B2

(12) United States Patent
Dehos et al.

(10) Patent No.: US 8,170,516 B2
(45) Date of Patent: May 1, 2012

(54) METHOD FOR THE DIGITAL COMPENSATION OF NONLINEARITIES IN A COMMUNICATION SYSTEM AND RECEIVER DEVICE

(75) Inventors: Cedric Dehos, Douarnenez (FR); Tim Schenk, Eindhoven (NL); Dominique Morche, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 1055 days.

(21) Appl. No.: 11/777,488

(22) Filed: Jul. 13, 2007

(65) Prior Publication Data
US 2008/0032631 A1    Feb. 7, 2008

(30) Foreign Application Priority Data
Aug. 4, 2006   (FR) ...................... 06 07147

(51) Int. Cl.
H04B 7/00   (2006.01)
H04B 1/16   (2006.01)
(52) U.S. Cl. .................. 455/239.1; 455/501; 455/67.11; 375/231
(58) Field of Classification Search .......... 455/501, 455/504, 505, 506, 507, 63.1, 67.11, 67.13, 455/67.14, 67.16, 239.1, 295, 296, 307, 308, 455/309, 310, 311; 375/231, 229, 233, 134, 375/222, 232, 230
See application file for complete search history.

(56) References Cited

U.S. PATENT DOCUMENTS
| 6,304,140 | B1 | 10/2001 | Thron et al. | |
| 6,653,958 | B1 | 11/2003 | Morche | |
| 2002/0034260 | A1* | 3/2002 | Kim | 375/296 |
| 2002/0158619 | A1* | 10/2002 | Chen | 324/76.12 |

FOREIGN PATENT DOCUMENTS
| GB | 2 407 950 A | 5/2005 |
| WO | WO 96/13109 | 5/1996 |
| WO | WO 9613109 A1 * | 5/1996 |
| WO | WO 2006/019612 A1 | 2/2006 |
| WO | WO 2006/090033 | 8/2006 |
| WO | WO 2006/104408 A1 | 10/2006 |

OTHER PUBLICATIONS

Mohamed Ibnkahla, "Application of Neural Networks to Digital Communications—A Survey", Signal Processing, vol. 80, N' 7, Jul. 2000, pp. 1185-1215.
Mohamed Ibnkahla, et al., "Neural Network Modeling and Indentification of Nonlinear Channels With Memory: Algorithms, Applications, and Analytic Models", IEEE Transactions on Signal Processing, vol. 46, No. 5, May 1998, pp. 1208-1220.
Khaled M. Gharaibeh, et al., "Estimation of In-Band Distortion in Digital Communication System", Microwave Symposium Digest, XP 10844946, Jun. 12, 2005, pp. 1963-1966.

* cited by examiner

*Primary Examiner* — Ping Hsieh
(74) *Attorney, Agent, or Firm* — Oblon, Spivak, McClelland, Maier & Neustadt, L.L.P.

(57) ABSTRACT

A method for digital compensation of nonlinearities in a communication system that includes a transmitter, a transmission channel and a receiver, including: estimating the nonlinearities induced by the transmitter and/or the receiver, from at least one learning sequence received at the receiver and distorted by the nonlinearities, and compensating for the nonlinearities distorting a signal received at the receiver based on the estimating of the nonlinearities.

29 Claims, 4 Drawing Sheets

METHOD FOR THE DIGITAL COMPENSATION OF NONLINEARITIES IN A COMMUNICATION SYSTEM AND RECEIVER DEVICE

TECHNICAL FIELD AND PRIOR ART

The present application relates to a method for the digital compensation of nonlinearities in a communication system, and a receiver device implementing such compensation. The present application relates more particularly to the compensation of nonlinearities in a signal, amplified at transmission and/or at reception, and distorted by the nonlinearities of the amplifiers or active components present at transmission and/or at reception in the communication system.

Nonlinear elements necessary for the transmission of information, such as power amplifiers or low noise amplifiers, are present in communication systems. Under the effects of the nonlinearities of these elements, a variable power signal transmitted in one of these communication systems is distorted, disturbing the reconstitution of the information carried by this signal at reception.

For systems using large dynamic modulations, such as Universal Mobile Telecommunications Systems (UMTS), Enhanced Data Rates for GSM Evolution (EDGE), or multi-carriers of the Orthogonal Frequency Division Multiplexing (OFDM) type, for example under standards 802.11a, 802.11n, 802.16e, etc., it is necessary, for the system to operate smoothly, for the amplifiers used at transmission to be linear, to the detriment of the effectiveness of these amplifiers and therefore of the energy consumption of the system.

To overcome this linearity defect, there are so-called "circuit" solutions, the purpose of which is to produce linear amplification while correcting the amplification obtained. This involves for example amplifier linearization methods, such as dynamic biasing, Cartesian loop, feedforward compensation, or the use of two amplifiers in parallel ("LINC").

There are also so-called "digital" solutions the purpose of which is to distort the signal received in an inverse way relative to the nonlinearities sustained by the signal during transmission, by signal processing methods.

Numerous digital pre-distortion schemes have been proposed, such as in document U.S. Pat. No. 6,304,140 for example, that implements a look-up table, or document WO 2006/019612 that implements pre-distortion with allowance made for amplifier memory effects.

DISCLOSURE OF THE INVENTION

There is a need for proposing a method that allows the nonlinearities present in all or part of the communication system to be compensated digitally. To this end, a method is proposed for the digital compensation of nonlinearities in a communication system that includes a transmitter, a transmission channel and a receiver, able to comprise:

at least one stage of estimating the nonlinearities present at transmission and/or at reception from at least one learning sequence, or pilot, received at the receiver end and distorted by said nonlinearities, at least one stage of compensating for the nonlinearities distorting a signal received at the receiver end from the previous estimation of the nonlinearities.

A method is also proposed for the digital compensation of nonlinearities in a communication system that includes a transmitter, a transmission channel and a receiver, comprising:

at least one stage of estimating the nonlinearities induced by the transmitter and/or the receiver from at least one learning sequence, or pilot, received at the receiver end and distorted by said nonlinearities, at least one stage of compensating for said nonlinearities distorting a signal received at the receiver end from the previous estimation of the nonlinearities.

In this way, it is possible to compensate for the nonlinearities present at the transmitter end, in other words generated or induced by the transmitter, for example generated by a power amplifier present in the transmitter, and/or at the receiver end, generated or induced by the receiver, for example by a Low Noise Amplifier (LNA), by a frequency mixer or a Variable Gain Amplifier (VGA) of a communication system.

The nonlinearities are compensated at reception and not at transmission, in other words after the signal has been transmitted and has passed through the transmission channel. It is therefore possible to use at the transmitter end a nonlinear amplifier since the signal nonlinearities are corrected at the reception end of the communication system.

The complexity of the algorithms for compensating for the nonlinearities is transferred to reception, which is particularly advantageous, especially where cellular networks are concerned. For example, in the case of an uplink between a mobile terminal and a base station, it is preferable to transfer the constraints to the base station, which has greater signal processing capacity compared with the mobile terminal. Since power amplification represents a large part of the power consumed by the mobile terminal the efficiency gain obtained at this level through the use of nonlinear components, like the amplifier, allows the mobile use time to be significantly increased or the energy saved to be transferred to other on-board applications.

It is therefore possible to get free of transmitter and/or receiver response nonlinearities which are a nonlinear function of the power (amplitude) of the transmitter and/or receiver input signal, unlike the channel nonlinearities, corresponding to the propagation channel frequency response, which are not linked to the amplitude of the transmitted signal.

This method may also be implemented in a receiver calibration phase. The known sequences (learning sequences or pilots) no longer then come from the transmitter but from the receiver. In this case, only nonlinearities introduced by the receiver are compensated.

Nonlinearities can be estimated through stages of:

calculating an orthonormal base of projection polynomials $\{p_0, p_1, \ldots, p_n\}$, calculating the nonlinearities approximation $g(\|\tilde{x}\|)$ for an AM-AM characteristic and/or an AM-PM characteristic of a gain element g to which all communication system nonlinearities are reduced, as a function respectively of the equation:

$$\|g(\|\hat{x}\|)\| = \sum_{k=0}^{n} cA_k p_k(\|x\|),$$

and/or of the equation:

$$\text{angle}(\hat{g}(\|x\|)) = \sum_{k=0}^{n} c\varphi_k p_k(\|x\|),$$

with $\{cA_0, cA_1, \ldots, cA_n\}$ coefficients of the AM-AM characteristic, $\{c\varphi_0, c\varphi_1, \ldots, c\varphi_n\}$ coefficients of the AM-PM characteristic, $\|g(\|x\|)\|$ the nonlinearities approximation module and angle$(g(\|x\|))$ the nonlinearities approximation phase, calculating abscissa $a_i$ and ordinate $b_i$ interpolation points of the nonlinearities characteristic $\hat{g}$ for the AM-AM characteristic and/or abscissa $c_i$ and ordinate $d_i$ interpolation points of the nonlinearities characteristic $\hat{g}$ for the AM-PM characteristic.

According to one embodiment of the invention, all the nonlinearities present in the communication system can be reduced to a single gain element g, for example an amplifier located at the transmitter end of the communication system. The AM-AM characteristic of this element therefore represents the curve of the amplitude of the output signal of this element as a function of the amplitude of the input signal of this element. The AM-PM characteristic is then the curve of the output signal phase as a function of the amplitude of the input signal of the gain element g.

The nonlinearities can be compensated by:

a stage of compensating the AM-AM characteristic from an interpolating polynomial obtained from abscissa $b_i$ and ordinate $a_i$ inverse interpolation points calculated previously, and/or a stage of compensating the AM-PM characteristic by subtracting a phase distortion evaluated at the received signal phase.

The AM-AM characteristic may be compensated by calculating the signal:

$$s_3'(t) = \sum_{j=1}^{m} a_j \prod_{i \neq j} \frac{\|s_2(t)\| - b_i}{b_j - b_i} \exp(j \cdot \text{angle}(s_2(t))),$$

with $s_2(t)$ the signal received, $\|s_2(t)\|$ the received signal module, angle $(s_2(t))$ the received signal phase, m the number of interpolation points, $(a_i, b_i)$ the coordinates of the interpolation points, the interpolating polynomial being able to be a Lagrange polynomial, and/or the AM-PM characteristic may be compensated by calculating the signal: $s_3(t) = s_3'(t) \cdot \exp(-j^* \text{angle}(\hat{g}(\|s_3'\|)))$, $s_3(t)$ being the nonlinearities compensated received signal and $\hat{g}$ the nonlinearities approximation.

The nonlinearities can be compensated by a joint compensation of the AM-AM and AM-PM characteristics from a complex interpolating polynomial by calculating the signal:

$$s_3(t) = \sum_{j=1}^{m} a_j \prod_{i \neq j} \frac{s_2(t) - b_i}{b_j - b_i},$$

with $s_2(t)$ the signal received, $s_3(t)$ the nonlinearities compensated received signal, $a_i$ and $b_i$ being respectively the abscissas and the ordinates of m interpolation points calculated previously.

The method for the digital compensation of nonlinearities may comprise before the nonlinearities estimation stage, a stage of estimating the transmission channel characteristic from at least one other learning sequence transmitted through the transmission channel. This estimation allows the transmission channel pulse response to be taken into account and corrected.

The estimated channel characteristic may be taken into account for estimating the nonlinearities.

The method for the digital compensation of nonlinearities may comprise after the nonlinearities compensation stage, an equalisation stage compensating for the channel noise present in the signal received from the estimation of the transmission channel characteristic.

The method for the digital compensation of nonlinearities may comprise after the nonlinearities compensation stage, a demodulation and/or decoding stage.

The signals and/or learning sequences received may be subject to a fast Fourier transform.

The learning sequence received at the receiver end for estimating the nonlinearities may be transmitted from the transmitter or the receiver.

A receiver device is also proposed intended to receive signals transmitted by a transmitter through a transmission channel, comprising at least digital nonlinearities compensation means, or digital nonlinearities compensator, that may include at least:

means for estimating, or an estimator, of the nonlinearities present at transmission and/or at reception from at least one learning sequence received and distorted by said nonlinearities, means for compensating, or a compensator, for the nonlinearities distorting a signal received from the previous estimation of the nonlinearities.

A receiver device is also proposed intended to receive signals transmitted by a transmitter through a transmission channel, comprising at least means for the digital compensation, or a digital compensator, for nonlinearities including at least:

means for estimating, or an estimator, of the nonlinearities induced by the transmitter and/or the receiver from at least one learning sequence received and distorted by said nonlinearities, means for compensating, or a compensator, for said nonlinearities distorting a signal received from the previous estimation of nonlinearities.

The means for estimating, or the estimator, of the nonlinearities may comprise at least:

means for calculating, or a calculator, of an orthonormal base of projection polynomials $\{p_0, p_1, \ldots, p_n\}$, means for calculating, or a calculator, of the nonlinearities approximation $g(\|\hat{x}\|)$ for an AM-AM characteristic and/or an AM-PM characteristic of a gain element g to which all communication system nonlinearities are reduced, as a function respectively of the equation:

$$\|g(\|\hat{x}\|)\| = \sum_{k=0}^{n} cA_k \, p_k(\|x\|),$$

and/or of the equation:

$$\text{angle}(\hat{g}(\|x\|)) = \sum_{k=0}^{n} c\varphi_k \, p_k(\|x\|),$$

with $\{cA_0, cA_1, \ldots, cA_n\}$ coefficients of the AM-AM characteristic, $\{c\phi_0, c\phi_1, \ldots, c\phi_n\}$ coefficients of the AM-PM characteristic, $\|g(\|x\|)\|$ the nonlinearities approximation module and $\text{angle}(g(\|x\|))$ the nonlinearities approximation phase, means for calculating, or a calculator, of abscissa $a_i$ and ordinate $b_i$ interpolation points of the nonlinearities characteristic $\hat{g}$ for the AM-AM characteristic and/or of abscissa $c_i$ and ordinate $d_i$ interpolation points of the nonlinearities characteristic $\hat{g}$ for the AM-PM characteristic.

The means for calculating, or the calculator, of the orthonormal base may implement a Gram-Schmidt orthonormalisation of a base $\{1, x, x^2, x^3, \ldots, x^n\}$.

The means for calculating, or the calculator, of the coefficients $\{cA_0, cA_1, \ldots, cA_n\}$, of the AM-AM characteristic and/or of the coefficients $\{c\phi_0, c\phi_1, \ldots, c\phi_n\}$ of the AM-PM characteristic may implement a projection of the learning sequence on the orthonormal base.

The means for calculating, or the calculator, of abscissa $a_i$ and ordinate $b_i$ interpolation points for the AM-AM characteristic may resolve the equation:

$$b_i = \|\hat{g}(a_i)\| = \sum_{k=0}^{n} cA_k \, p_k(a_i),$$

and/or the means for calculating, or the calculator, of the abscissa $c_i$ and ordinate $d_i$ interpolation points for the AM-PM characteristic may resolve the equation:

$$d_i = \text{angle}(\hat{g}(c_i)) = \sum_{k=0}^{n} c\varphi_k \, p_k(c_i).$$

The means for calculating, or the calculator, of the orthonormal base may implement a Gram-Schmidt orthonormalisation of a base $\{1, x, x^*, x^2, xx^*, \ldots\}$ and the means for calculating, or the calculator, of the nonlinearities approximation resolving the equation:

$$g(\|\hat{x}\|) = \|g(\|\hat{x}\|)\| \exp(j \cdot \text{angle}(g(\|\hat{x}\|))) =$$

$$\left(\sum_{k=0}^{n} cA_k \, p_k(\|x\|)\right) \exp\left(j * \left(\sum_{k=0}^{n} c\varphi_k \, p_k(\|x\|)\right)\right)$$

The means for compensating, or compensator, for the nonlinearities may comprise at least:
means for the compensation, or a compensator, of the AM-AM characteristic from an interpolating polynomial obtained from abscissa $a_i$ and ordinate $b_i$ interpolation points calculated previously, and/or
means for the compensation, or a compensator, of the AM-PM characteristic by subtracting a phase distortion evaluated at the received signal phase.

The compensation means, or the compensator, of the AM-AM characteristic may calculate the signal:

$$s'_3(t) = \sum_{j=1}^{m} a_j \prod_{i \neq j} \frac{\|s2(t)\| - b_i}{b_j - b_i} \exp(j \cdot \text{angle}(s2(t))),$$

with $s_2(t)$ the signal received, $s_2(t)$ the received signal module, angle $(s_2(t))$ the received signal phase, m the number of interpolation points, $(a_i, b_i)$ the coordinates of the interpolation points and the interpolating polynomial being a Lagrange polynomial, and/or the compensation means, or compensator of the AM-PM characteristic being able to calculate the signal:

$$s_3(t) = s_3'(t) \cdot \exp(-j * \text{angle}(\hat{g}(\|s_3'\|))),$$

$s_3(t)$ being the nonlinearities compensated received signal and $\hat{g}$ the nonlinearities approximation.

The compensation means, or the compensator, of the nonlinearities may implement a joint compensation of the AM-AM and AM-PM characteristics from a complex interpolating polynomial by calculating the signal:

$$s_3(t) = \sum_{j=1}^{m} a_j \prod_{i \neq j} \frac{s2(t) - b_i}{b_j - b_i}.$$

The receiver device may comprise at least means for estimating, or an estimator, of the transmission channel characteristic from at least one other learning sequence transmitted through the transmission channel.

The estimated channel characteristic may be taken into account by the nonlinearities estimation means, or estimator.

The receiver device may comprise at least equalisation means, or an equaliser, compensating for the channel noise present in the signal received from the estimation of the transmission channel characteristic.

The receiver device may also comprise at least demodulation means, or a demodulator, and/or decoding means, or a decoder.

The receiver device may comprise fast Fourier transform (FFT) means, or a fast Fourier transformer, implementing an FFT of the signals and/or learning sequences received.

The receiver device may be a wireless base station.

BRIEF DESCRIPTION OF THE DRAWINGS

The present invention will be better understood by reading the description of embodiments given purely by way of illustration and in no way limitative respectively with reference to the appended drawings in which.

Identical, similar or equivalent parts of the different figures described hereinafter carry the same digital references so as to facilitate moving between one figure and the next.

DETAILED DISCLOSURE OF PARTICULAR EMBODIMENTS

Figure 1:
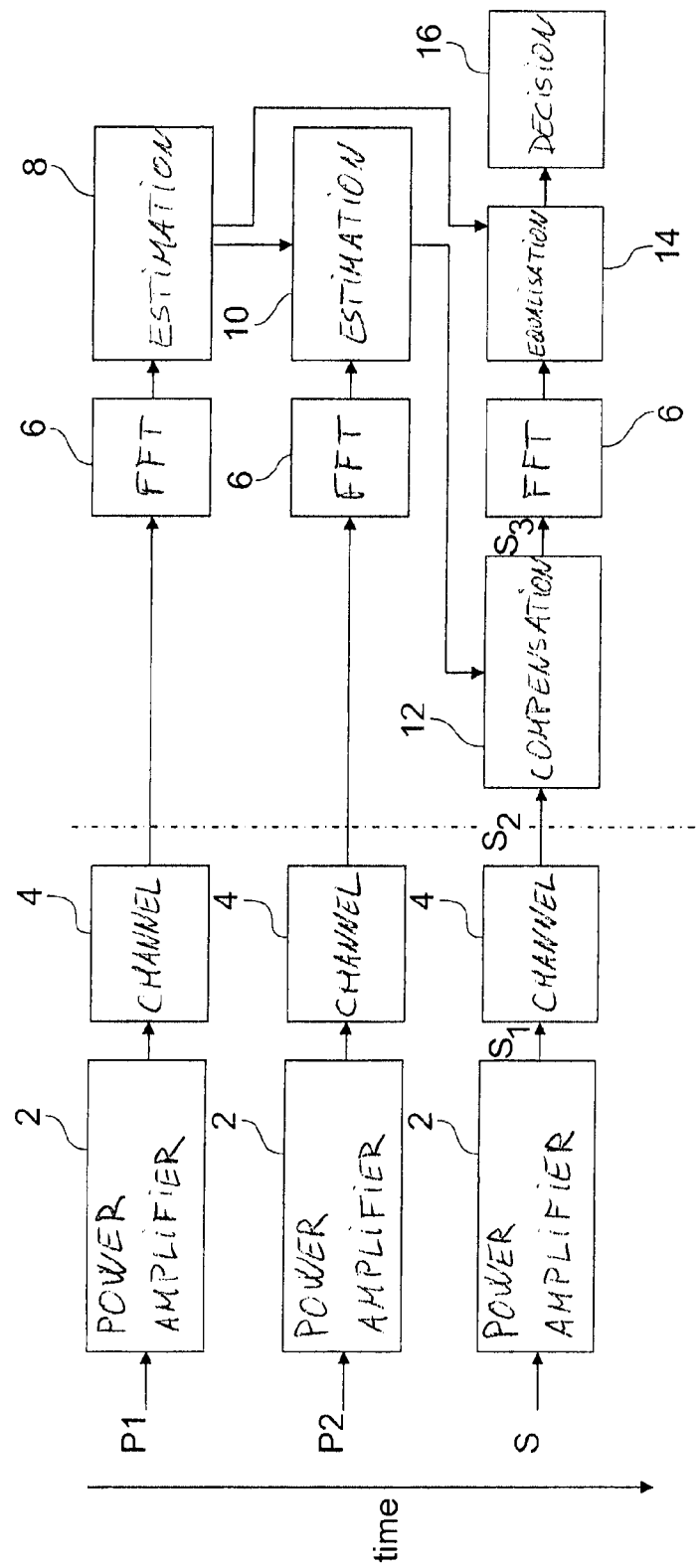
FIG. 1 shows a time-based operation of a method for the digital compensation of nonlinearities in a communication system.
Figure 6:
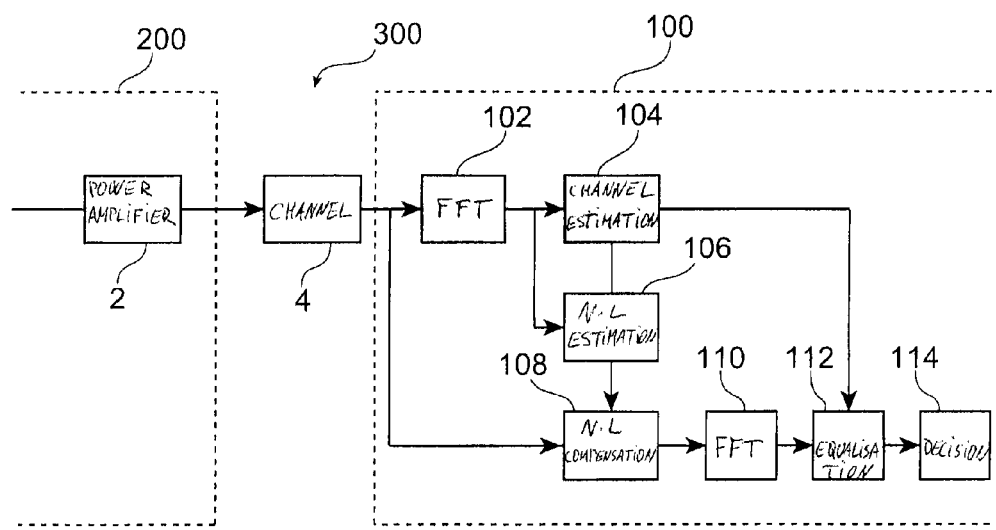
FIG. 6 shows a communication system comprising a receiver device.

Reference is made first of all to FIG. 1 which shows a time-based operation of a method for the digital compensation of non-linearities in a communication system 300 according to a particular embodiment, in combination with FIG. 6 showing the communication system 300 comprising a receiver device 100, such as a base station. In this embodiment, the method is applied to a wireless communication system 300 with OFDM type modulation between a mobile terminal 200 and a base station 100. But an embodiment of the invention may also apply to other systems of the single carrier or ultra broadband type, between any transmitter and any receiver.

In the example in FIGS. 1 and 6, a power amplifier 2 found at the mobile terminal end 200 is considered as the single source of nonlinearities in the whole communication system 300. But an embodiment of the invention allows other sources of nonlinearities to be compensated in the communication system 300, at the transmitter 200 and/or receiver 100 end, such as for example those due for example to a low noise amplifier, a variable gain amplifier, a mixer etc.

The signals considered here are complex and sampled in the time or frequency domain.

Let s be a signal intended to be amplified by the power amplifier 2 and emerging from the amplifier 2 in the form s1 before being transmitted in a transmission channel 4. In the time domain, we have:

$$s_1(t)=g(\|s(t)\|) \cdot s(t) \quad (1)$$

where g is the amplifier gain.

g is a function of the amplitude of the input signal s. This gain g may modify the amplitude and/or the phase of the input signal s in a non-linear way, introducing nonlinearities into the communication system 300 when the AM-AM characteristic, in other words the curve of the output signal amplitude as a function of the input signal amplitude, and/or the AM-PM characteristic, in other words the curve of the output signal phase as a function of the input signal amplitude, of the gain element g, here the amplifier 2, is not linear.

In the frequency domain, S1 is the result of the convolution between the gain G of the amplifier 2 and the incoming signal S in the amplifier:

$$S_1(f)=G(S(f))*S(f) \quad (2)$$

The amplified signal S1 is then transmitted by one or more antennae, and passes into the transmission channel 4. At the output of the transmission channel 4 a signal S2 is obtained such that:

$$S_2(f)=H(f) \cdot S_1(f)+\eta(f) \quad (3)$$

where H stands for the transmission characteristic of the channel 4 in the frequency domain and $\eta$ an additive white gaussian noise.

In this embodiment, prior to the transmission of the information signal S, at least one first learning sequence, or pilot, is used to estimate the characteristic of the channel 4. To do this, P1 follows the same transmission path as the information signals to be transmitted, in other words being firstly subject to an amplification stage by the power amplifier 2, then a passing through of the transmission channel 4. On reception, in other words at the output of the transmission channel 4, P1 is subject, in this embodiment, to a fast Fourier transform (FFT) (reference 6 in FIG. 1) so as to move P1 into the frequency domain. In FIG. 6, this FFT is implemented using fast Fourier transform means 102. This FFT is the example used where an OFDM system is involved, as is the case in this embodiment.

After this FFT, the characteristic of the channel 4 is then subject to estimation 8. This estimation is implemented using channel characteristic estimation means 104. The amplitude of P1 is chosen preferably to be substantially constant or of small dynamic, in other words having a low PAPR (Peak to Average Power Ratio). Only the P1 phase changes. In this way, the nonlinearities present in the communication system 300 do not bias the estimation of the channel 4, since in that way, they have no or little influence over P1. The channel 4 is estimated by measuring, frequency by frequency, the difference between the sequence received at the output of the channel 4 and the initial learning sequence P1. For example, in the case of an OFDM system, the characteristic of the channel 4 is obtained directly from the ratio between the received sequence and the initial learning sequence P1, this sequence being for example an alternate set of symbols of values +1 and −1.

The nonlinearities present in the communication system 300 are subject to estimation 10, after the channel 4 estimation is obtained. In the example in FIGS. 1 and 6, the estimated nonlinearities are those of the power amplifier 2. This estimation 10 of nonlinearities consists in determining interpolation points of the AM-AM characteristic and/or of the AM-PM characteristic of the amplifier 2.

To do this, at least one pilot P2 is first amplified by the power amplifier 2 then sent through the transmission channel 4. Given that the communication system is of the OFDM type, the pilot P2 is subject to an FFT 6 by the FFT means 102, as previously for P1 during the estimation of the channel 4. This estimation 10 is implemented using nonlinearities estimation means 106.

To implement the estimation 10 of the nonlinearities, an orthonormal base of projection polynomials $\{p_0, p_1, \ldots, p_n\}$ is first calculated. This base is obtained from moments of the amplitude of the learning sequences or pilots transmitted, in other words from moments of the amplitude of initial P2 before it is sent through the power amplifier 2 and the channel 4.

After P2 has been subject to the FFT 6, coefficients $\{cA_0, cA_1, \ldots, cA_n\}$ of the AM-AM characteristic and/or coefficients $\{c\phi_0, c\phi_1, \ldots, c\phi_n\}$ of the AM-PM characteristic can be determined by projecting P2 on the orthonormal base $\{p_0, p_1, \ldots, p_n\}$. These coefficients allow nonlinearities approximation to be obtained such that:

$$\hat{g}(\|x\|) = (cA_0 p_0(\|x\|) + cA_1 p_1(\|x\|) + \ldots cA_n p_n(\|x\|)) \exp(j^* \\ (c\varphi_0 p_0(\|x\|) + c\varphi_1 p_1(\|x\|) + \ldots c\varphi_n p_n(\|x\|))) \quad (4)$$

This projection allows a good estimation of the whole nonlinearities characteristic to be obtained despite the presence of noise in the channel 4.

Lastly, from this approximation, the interpolation points of coordinates $b_i = \hat{g}(a_i)$ of the nonlinearities characteristic $\hat{g}$ are calculated.

The different amplitudes of the symbols forming the learning sequence P2 will be selected so as to cover as far as possible the whole dynamic of the amplitude of the signals transmitted subsequently by the communication system 300, so as to take into account all the nonlinearities sustained by the signals transmitted through the communication system 300.

The estimation of the AM-AM characteristic will now be specified.

Prior to calculating the orthonormal base of projection polynomials $\{p_0, p_1, \ldots, p_n\}$, it is appropriate to define a scalar product adapted to the vector space formed by this orthonormal base.

In the time domain, the scalar product associated with this orthonormalisation is the expected product over a certain observation time T, such that:

$$\langle u, v \rangle = E[u(t)v(t)]_{t \in [0,T]} \quad (5)$$

For a system sampled at $$T_e = \frac{T}{N}:$$

$$\langle u, v \rangle = \sum_{k=0}^{N} u(k)v(k) \quad (6)$$

In the frequency domain, the scalar product associated with this orthonormalisation is the expected convolution product over a certain observation frequency band B, such that:

$$\langle U, V \rangle = E[U(f)^* V(f)]_{f \in [0,B]} \quad (7)$$

For a system sampled at $F_e = F^*N$:

$$\langle U, V \rangle = \sum_{k=0}^{N} U(k)V(k) \quad (8)$$

This scalar product selected is in fact a bilinear, symmetrical and defined positive function.

An orthonormal base of projection polynomials $\{p_0, p_1, \ldots, p_n\}$ can be obtained by the Gram-Schmidt method for the orthonormalisation of a base $\{1, x, x^2, x^3, \ldots, x^n\}$.

Here for example are the first three polynomials obtained for the orthonormal base in the time domain:

$$p_0(x) = 1$$

$$p_1(x) = \frac{x - \langle p_0, p \rangle p_0(x)}{\|x - \langle p_0, p \rangle p_0(x)\|} = \frac{x - \chi_1}{\sqrt{\chi_2 - \chi_1}}$$

$$p_2(x) = \frac{x^2 - \langle p_0, p^2 \rangle p_0(x) - \langle p_1, p^2 \rangle p_1(x)}{\|x^2 - \langle p_0, p^2 \rangle p_0(x) - \langle p_1, p^2 \rangle p_1(x)\|}$$

$$= \frac{x^2 - (\chi_3 - \chi_2 \chi_1)x + ((\chi_3 - \chi_2 \chi_1)\chi_1 - \chi_2)}{\sqrt{\chi_4 + (\chi_3 - \chi_2 \chi_1)^2 + ((\chi_3 - \chi_2 \chi_1)\chi_1 - \chi_2)^2 - 2(\chi_3 - \chi_2 \chi_1)\chi_2 + 2\chi_2((\chi_3 - \chi_2 \chi_1)\chi_1 - \chi_2) - 2((\chi_3 - \chi_2 \chi_1)\chi_1 - \chi_2)(\chi_3 - \chi_2 \chi_1)\chi_1}}$$

With $\chi_1 = E[p]$, $\chi_2 = E[p^2]$, $\chi_3 = E[p^3]$, $\chi_4 = E[p^4]$ the moments of p, in other words the moments of the amplitude of initial P2 before it is sent through the amplifier 2.

For an estimation in the frequency domain, an orthonormal base is constructed in the same way taking the formulas (7) and (8) for the scalar product calculations.

The number of polynomials forming this orthonormal base is selected as a function of the precision required in respect of estimating nonlinearities, and of the complexity of the algorithm generated by a large number of polynomials.

The channel estimation 8 implemented previously is then used to obtain y(t), the amplitude of P2 corrected by the effects of the transmission channel 4. In this way, an amplitude y(t) of the pilot P2 affected solely by the nonlinearities of the amplifier 2 is obtained.

The nonlinearities characteristic is then estimated by projecting y(t) on the orthonormal time or frequency base, previously calculated. The coefficients $\{cA_0, cA_1, \ldots, cA_n\}$ of the AM-AM characteristic are obtained by:

$$cA_k = \langle \|y\|, p_k \rangle \quad (9)$$

The calculation of the nonlinearities approximation for the AM-AM characteristic may therefore be:

$$\|g(\|\hat{s}\|)\| = \sum_{k=0}^{n} \langle \|y\|, p_k \rangle p_k(\|s\|) = \sum_{k=0}^{n} cA_k p_k(\|s\|) \quad (10)$$

In order to be able to use this approximation, a certain number of interpolation points of the nonlinearities characteristic $\hat{g}$ is calculated. 5 interpolation points may for example be selected.

Let $\{a_1, a_2, \ldots, a_m\}$ be the abscissas and $\{b_1, b_2, \ldots, b_m\}$ the ordinates of the interpolation points of the AM-AM characteristic.

In order to obtain a good description of the nonlinearities of the power amplifier 2, the $a_i$ may be chosen so as to have a majority of the interpolation points corresponding to the low amplitudes of the AM-AM characteristic, for example by distributing them exponentially.

In this embodiment, the ordinates of these interpolation points are given by the equation:

$$b_i = \|\hat{g}(a_i)\| = \sum_{k=0}^{n} cA_k p_k(a_i) = \sum_{k=0}^{n} \langle y, p_k \rangle p_k(a_i) \quad (11)$$

The $P_k(x)$ and $P_k(a_i)$ may be calculated previously from the pilot P2 used, and the abscissas of the interpolation points $a_i$, a multiplication-accumulation then allowing the $b_i$ to be obtained.

The interpolation points are therefore obtained at the cost of low complexity. This projection makes it possible to use all available samples of y(t), thereby obtaining a robust to noise estimation of nonlinearities.

In order to obtain an estimation of the AM-PM characteristic, by choosing the same orthonormal time base, the phase difference φ(t) is projected between the learning sequences, or pilots, received and transmitted, on this orthonormal base.

In a way similar to the AM-AM characteristic, the calculation of the nonlinearities approximation for the AM-PM characteristic may therefore be:

$$\text{angle}(\hat{g}(\|s\|)) = \sum_{k=0}^{n} \langle \varphi, p_k \rangle p_k(\|s\|) = \sum_{k=0}^{n} c\varphi_k p_k(\|s\|) \quad (12)$$

Let $\{c_1, c_2, \ldots, c_n\}$ be the abscissas and $\{d_1, d_2, \ldots, d_n\}$ the ordinates of the interpolation points of the AM-PM characteristic.

In this embodiment, the ordinates of these interpolation points are given by the equation:

$$d_i = \text{angle}(\hat{g}(c_i)) = \sum_{k=0}^{n} c\varphi_k p_k(c_i) = \sum_{k=0}^{n} \langle \varphi, p_k \rangle p_k(c_i) \quad (13)$$

In order to obtain a good description of the nonlinearities of the power amplifier, the abscissas $c_i$ of the in-phase characteristic may also be chosen so as to have more points for the low amplitudes, for example by distributing them exponentially.

To obtain both the AM-AM and AM-PM characteristics, it is possible either to project amplitude and phase of the received pilot successively according to the equations (10) and (12) or to use an orthonormal base of the space of the complex polynomials for the norm considered.

According to this variant, the Gram-Schmidt orthonormalisation is then carried out from a base $\{1, x, x^*, x^2, xx^*, \ldots\}$. The complex pilot received can then be projected directly on this base.

The nonlinearities approximation is therefore in this case:

$$g(\|\hat{s}\|) = \|g(\|\hat{s}\|)\| \exp(j \cdot \text{angle}(g(\|\hat{s}\|))) \quad (14)$$
$$= \sum_{k=0}^{n} \langle y \cdot \exp(j\varphi), p_k(s) \rangle p_k(\|s\|)$$

$$g(\|\hat{s}\|) = \left( \sum_{k=0}^{n} cA_k p_k(\|s\|) \right) \exp\left( j * \left( \sum_{k=0}^{n} c\varphi_k p_k(\|s\|) \right) \right)$$

The interpolation points obtained are then also complex.

Figure 2:
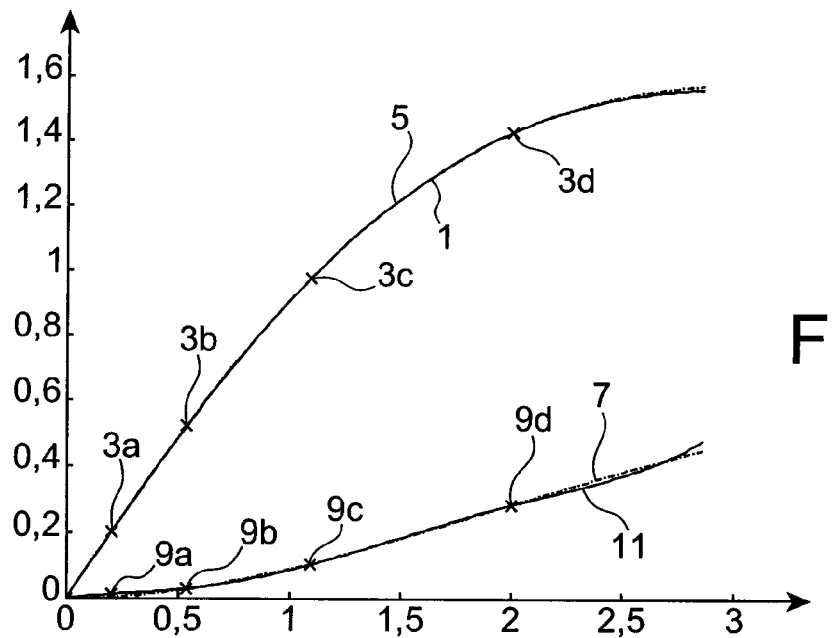
FIG. 2 shows real AM-AM and AM-PM characteristics of an amplifier and the approximation of the AM-AM and AM-PM characteristics obtained under the method for the digital compensation of nonlinearities.

FIG. 2 shows the approximation of the AM-AM and AM-PM characteristics ordained by projection on an orthonormal base of three polynomials of a learning sequence of 64 time samples distorted at transmission by a Solid State Power Amplifier (SSPA). The curve 1 shows the real AM-AM characteristic. From 4 interpolation points 3a to 3d, the approximation of the AM-AM characteristic shown by the curve 5 is obtained. In FIG. 2 it can be seen that the approximation of the AM-AM characteristic 5 is almost superimposed over the real AM-AM characteristic 1. A similar result is obtained for the AM-PM characteristic, the curve 7 representing the real AM-PM characteristic and the curve 11 representing the approximation of the AM-PM characteristic obtained by the interpolation points 9a to 9d. The approximation of the AM-PM characteristic 11 obtained is almost superimposed over the real AM-PM characteristic 7.

Since the nonlinearities are estimated, it is now possible to implement compensation 12 for the nonlinearities sustained by an information signal s transmitted in the communications system 300.

The nonlinearities can be compensated immediately after the analogue-to-digital conversion of the signal in the communication system 300, after the transmission of signal s in the channel 4. This signal is denoted $s_2(t)$ in FIG. 1. In FIG. 6, the signal received is sent to nonlinearities compensation means 108.

It is possible to implement a compensation for the AM-AM characteristic, and then a compensation for the AM-PM characteristic.

In this case, an interpolating polynomial, for example a Lagrange polynomial, is calculated, using the interpolation points $(a_i, b_i)$ to invert characteristic in amplitude of the amplifier 2. The following signal is then obtained:

$$s_3'(t) = \sum_{j=1}^{m} a_j \prod_{i \neq j} \frac{\|s_2(t)\|}{b_j - b_i} \exp(j \cdot \text{angle}(s_2(t))) \quad (15)$$

The abscissas and ordinates of the interpolation points have been inverted. In this way the inverse nonlinearities characteristic is directly interpolated from inverse abscissa $b_i$ and ordinate $a_i$ interpolation points. The Lagrange polynomials are advantageous on account of their reliability in describing a bijective amplifier characteristic and their adapted implementation. Other interpolating polynomials, other than those of Lagrange, can also be selected (splines, Newton, etc.).

Using this compensation method, it is not necessary to have a high order Lagrange polynomial in order to get effective compensation for nonlinearities.

Figure 3:
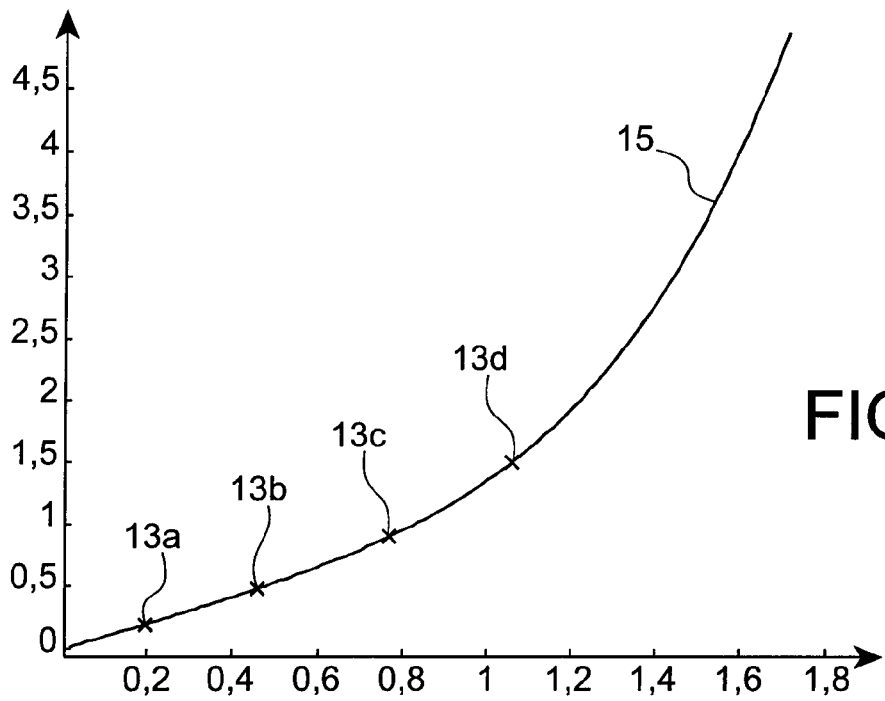
FIG. 3 shows a Lagrange interpolating polynomial obtained under the method for the digital compensation of nonlinearities.

FIG. 3 shows a Lagrange interpolating polynomial 15, showing the inverse AM-AM characteristic, obtained from 4 interpolation points 13a to 13d, the abscissas and ordinates of which have been inverted.

Since the AM-AM characteristic is compensated, phase distortion is then evaluated as a function of the amplitude by the equation:

$$\text{angle}(g(\|\hat{s}_3'\|)) = \sum_{k=0}^{n} \langle \varphi, p_k \rangle p_k(\|s_3'\|) \quad (16)$$

This phase then just needs to be subtracted from the signal phase to correct the AM-PM characteristic and obtain at the output some compensation 12 of nonlinearities:

$$s_3(t)=s_3'(t)\cdot\exp(-j*\text{angle}(\hat{g}(\|s_3'\|))) \quad (17)$$

Figure 4A:
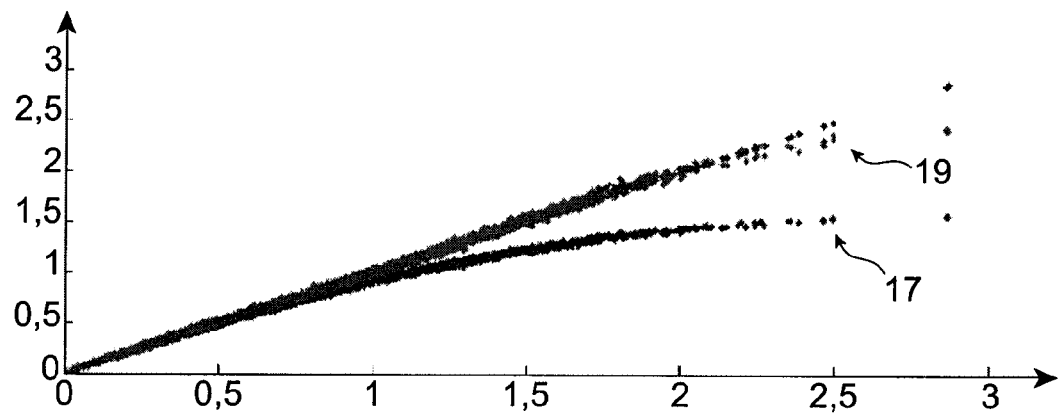
FIGS. 4A and 4B show results of a compensation simulation of AM-AM and AM-PM characteristics.
Figure 4B:
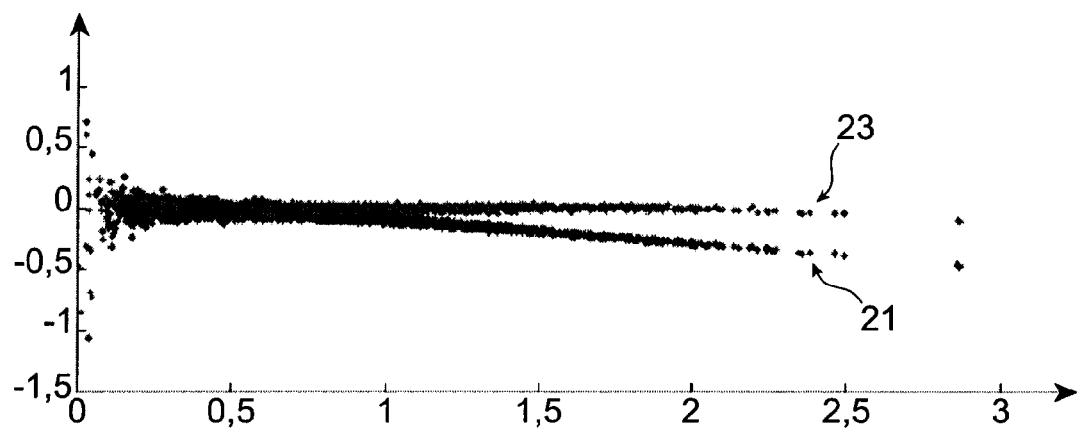

FIG. 4A shows results of compensation simulation of the AM-AM characteristic. The set of points 17 show the AM-AM characteristic obtained at output with no compensation method. The set of points 19 shows the AM-AM characteristic obtained with the compensation method, with a learning sequence of 64 symbols and in the presence of noise on the transmission channel. It can be seen that the compensation method makes it possible to obtain a compensated signal almost similar to a linear signal. In the same way, FIG. 4B shows results of compensation simulation of the AM-PM characteristic. The set of points 21 shows the AM-PM characteristic obtained at output with no compensation method. The set of points 23 shows the AM-PM characteristic obtained with the compensation method, with a learning sequence of 64 symbols and in the presence of noise on the transmission channel. There again, it can be seen that the compensation method allows a compensated signal to be obtained that is almost similar to a linear signal.

Instead of firstly compensating the AM-AM characteristic and then the AM-PM characteristic, it is also possible to implement a joint compensation of the AM-AM and AM-PM characteristics.

In this case, a complex Lagrange polynomial is used to interpolate the in amplitude and in phase characteristic of the amplifier:

$$s_3(t) = \sum_{j=1}^{m} a_j \prod_{i \neq j} \frac{s_2(t) - b_i}{b_j - b_i} \quad (18)$$

where the pairs $(a_i, b_i)$ are obtained after projection on a base of complex polynomials.

Figure 5:
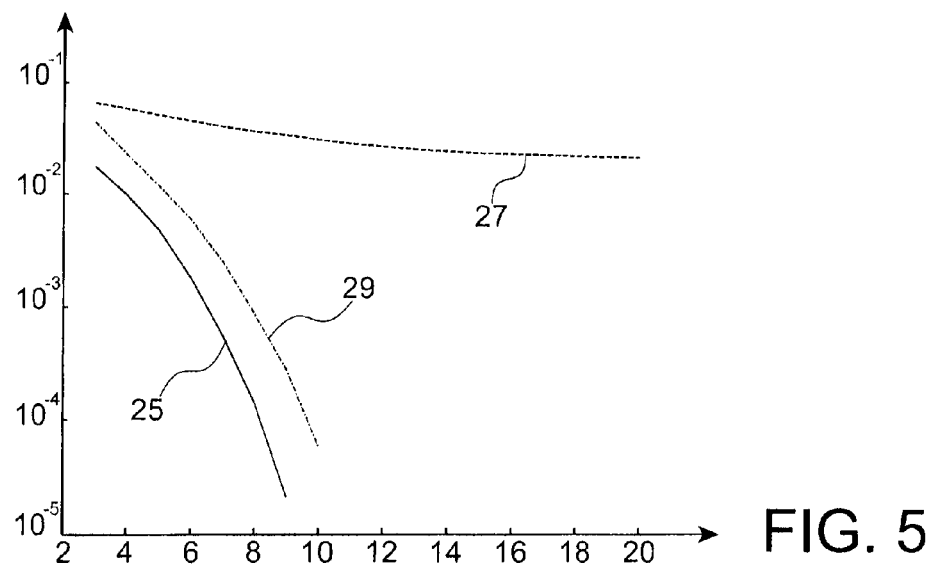
FIG. 5 shows the gain in terms of bit error rate obtained by the method for the digital compensation of nonlinearities.

The gain in terms of bit error rate is shown in FIG. 5. In this figure, the curves represent the bit error rate (BER) as a function of the signal to noise ratio (SNR) for an OFDM system comprising an amplifier of the travelling wave tube (TWT) type. The curves 25, 27 and 29 show respectively the case of an ideal signal, an uncompensated signal, and a signal compensated by the compensation method.

The signal whereof the nonlinearities have been compensated can then be passed into the frequency domain by an FFT 6 (FIG. 1) implemented by FFT means 110 in FIG. 6, for example in the case of a communication system of the OFDM type. This signal may then pass through an equalisation phase 14 in order to compensate the noise of the channel 4. This equalisation phase may be implemented by equalisation means 112. This equalisation 14 may be obtained by subtracting the channel estimation 8 implemented previously by means 104 for estimating the channel characteristic of the signal received. Lastly, after the equalisation phase, the signal may pass through a decision phase 16 demodulating and decoding for example the signal, implemented by means 114 in FIG. 6.

One embodiment of the invention is compatible with a method for restricting or clipping the power to be transmitted upstream of the power amplifier 2, and a method for compensating the distortions caused by such clipping at the receiver end. To do this, the maximum amplitude of the learning sequence or pilot is defined as being lower than the clipping level.

The method according to one embodiment of the invention can for example be implemented in communication systems of the OFDM, WCDMA, EDGE type, or more generally in all radio, wire, optical communication systems etc.

The invention claimed is:

1. A method for digital compensation of nonlinearities in a communication system that includes a transmitter, a transmission channel and a receiver, comprising:
   estimating the nonlinearities induced by the transmitter and/or the receiver, from at least one learning sequence received at the receiver and distorted by said nonlinearities, wherein said estimating includes calculating a nonlinearities approximation $\hat{g}$ for an AM-AM characteristic and/or an AM-PM characteristic of a gain element g to which all communication system nonlinearities are reduced,
   compensating for said nonlinearities distorting a signal received at the receiver based on the estimating of said nonlinearities, and
   after the compensating for said nonlinearities, demodulating and/or decoding.

2. The method according to claim 1, wherein the estimating the nonlinearities includes:
   calculating an orthonormal base of projection polynomials $\{p_0, p_1, \ldots, p_n\}$, and
   the nonlinearities approximation $\hat{g}$ is $g(\|\hat{x}\|)$, which is a function respectively of the equation:

$$\|g(\|\hat{x}\|)\| = \sum_{k=0}^{n} cA_k p_k(\|x\|),$$

and/or of the equation:

$$\text{angle}(\hat{g}(\|x\|)) = \sum_{k=0}^{n} c\varphi_k p_k(\|x\|),$$

with $\{cA_0, cA_1, \ldots, cA_n\}$ as coefficients of the AM-AM characteristic, $\{c\phi_0, c\phi_1, \ldots, c\phi_n\}$ as coefficients of the AM-PM characteristic, and $\text{angle}(g(\|x\|))$ as a nonlinearities approximation phase, and
   calculating abscissa $a_i$ and ordinate $b_i$ interpolation points of the nonlinearities characteristic $\hat{g}$ for the AM-AM characteristic and/or abscissa $c_i$ and ordinate $d_i$ interpolation points of the nonlinearities characteristic $\hat{g}$ for the AM-PM characteristic.

3. The method according to claim 2, wherein the orthonormal base is obtained by a Gram-Schmidt orthonormalisation of a base $\{1, x, x^2, x^3, \ldots, x^n\}$.

4. The method according to claim 2, wherein the coefficients $\{cA_0, cA_1, \ldots, cA_n\}$ of the AM-AM characteristic and/or the coefficients $\{c\phi_0, c\phi_1, \ldots, c\phi_n\}$ of the AM-PM characteristic are calculated by projection of the at least one learning sequence on the orthonormal base.

5. The method according to claim 2, wherein the abscissa $a_i$ and ordinate $b_i$ interpolation points for the AM-AM characteristic are calculated according to the equation:

$$b_i = \|\hat{g}(a_i)\| = \sum_{k=0}^{n} cA_k p_k(a_i),$$

and/or the abscissa $c_i$ and ordinate $d_i$ interpolation points for the AM-PM characteristic are calculated according to the equation:

$$d_i = \text{angle}(\hat{g}(c_i)) = \sum_{k=0}^{n} c\varphi_k p_k(c_i).$$

6. The method according to claim 2, wherein the orthonormal base is obtained by a Gram-Schmidt orthonormalisation of a base $\{1,x,x^*x^2,xx^*, \ldots\}$ and the nonlinearities approximation is calculated according to the equation:

$$g(\|\hat{x}\|) = \|g(\|\hat{x}\|)\|\exp(j \cdot \text{angle}(g(\|\hat{x}\|)))$$
$$= \left(\sum_{k=0}^{n} cA_k p_k(\|x\|)\right) \exp\left(j * \left(\sum_{k=0}^{n} c\varphi_k p_k(\|x\|)\right)\right).$$

7. The method according to claim 1, wherein the compensating comprises:
  compensating the AM-AM characteristic from an interpolating polynomial obtained from inverse abscissa $b_i$ and ordinate $a_i$ interpolation points calculated previously, and/or
  compensating the AM-PM characteristic by subtracting a phase distortion evaluated at a received signal phase.

8. The method according to claim 7, wherein the AM-AM characteristic is compensated by calculating the signal:

$$s_3'(t) = \sum_{j=1}^{m} a_j \prod_{i \neq j} \frac{\|s_2(t)\| - b_i}{b_j - b_i} \exp(j \cdot \text{angle}(s_2(t))),$$

with $s_2(t)$ as the signal received, $\|s_2(t)\|$ as a received signal module, $\text{angle}(s_2(t))$ as the received signal phase, m as a number of interpolation points, $(a_i,b_i)$ as coordinates of the interpolation points, and the interpolating polynomial is a Lagrange polynomial, and/or
the AM-PM characteristic is compensated by calculating the signal:

$$s_3(t) = s_3'(t) \cdot \exp(-j * \text{angle}(\hat{g}(\|s_3'\|))),$$

$s_3(t)$ is a nonlinearities compensated received signal.

9. The method according to claim 1, wherein the nonlinearities are compensated by a joint compensation of the AM-AM and the AM-PM characteristics from a complex interpolating polynomial by calculating the signal:

$$s_3(t) = \sum_{j=1}^{m} a_j \prod_{i \neq j} \frac{s_2(t) - b_i}{b_j - b_i},$$

with $s_2(t)$ as the signal received, $s_3(t)$ as a nonlinearities compensated received signal, $a_i$ and $b_i$ respectively as abscissas and ordinates of m interpolation points calculated previously.

10. The method according to claim 1, further comprising, before the estimating of the nonlinearities, estimating a characteristic of the transmission channel from at least one other learning sequence transmitted through the transmission channel.

11. The method according to claim 10, wherein an amplitude of the at least one other learning sequence is substantially constant.

12. The method according to claim 10, wherein the estimated transmission channel characteristic is taken into account for the estimating the nonlinearities.

13. The method according to claim 10, further comprising, after the compensating the nonlinearities, compensating for channel noise present in the signal based on the estimation of the transmission channel characteristic.

14. The method according to claim 1, wherein the signal and/or at least one learning sequence received is subject to a fast Fourier transform.

15. The method according to claim 1, wherein the at least one learning sequence received at the receiver is transmitted from the transmitter or the receiver.

16. A receiver device intended to receive signals transmitted by a transmitter through a transmission channel, comprising:
  at least one digital nonlinearities compensator that includes at least,
  an estimator configured to estimate the nonlinearities induced by the transmitter and/or the receiver from at least one learning sequence received and distorted by said nonlinearities, wherein said estimate is generated by a calculation of a nonlinearities approximation $\hat{g}$ for an AM-AM characteristic and/or an AM-PM characteristic of a gain element g to which all communication system nonlinearities are reduced,
  a compensator configured to compensate for said nonlinearities distorting a signal received based on the estimate of the nonlinearities by the estimator, and
  at least one demodulator and/or one decoder, wherein demodulation and/or decoding is implemented after the compensator compensates for said nonlinearities.

17. The device according to claim 16, wherein the estimator further comprises at least:
  a calculator configured to calculate an orthonormal base of projection polynomials $\{p_0,p_1, \ldots, p_n\}$, and
  the nonlinearities approximation $\hat{g}$ is $g(\|\hat{x}\|)$, which is a function respectively of the equation:

$$\|g(\|\hat{x}\|)\| = \sum_{k=0}^{n} cA_k p_k(\|x\|),$$

and/or of the equation:

$$\text{angle}(\hat{g}(\|x\|)) = \sum_{k=0}^{n} c\varphi_k p_k(\|x\|),$$

with $\{cA_0,cA_1, \ldots, cA_n\}$ as coefficients of the AM-AM characteristic, $\{c\phi_0,c\phi_1, \ldots, c\phi_n\}$ as coefficients of the AM-PM characteristic, and $\text{angle}(g(\|x\|))$ as a nonlinearities approximation phase, and
a calculator configured to calculate abscissa $a_i$ and ordinate $b_i$ interpolation points of the nonlinearities characteristic $\hat{g}$ for the AM-AM characteristic and/or of abscissa $c_i$ and ordinate $d_i$ interpolation points of the nonlinearities characteristic $\hat{g}$ for the AM-PM characteristic.

18. The device according to claim 17, wherein the calculator of the orthonormal base is configured to implement a Gram-Schmidt orthonormalisation of a base $\{1,x,x^2,x^3, \ldots, x^n\}$.

19. The device according to claim 17, wherein the calculator of the coefficients $\{cA_0, cA_1, \ldots, cA_n\}$ of the AM-AM characteristic and/or of the coefficients $\{c\phi_0, c\phi_1, \ldots, c\phi_n\}$ of the AM-PM characteristic is configured to implement a projection of the at least one learning sequence on the orthonormal base.

20. The device according to claim 17, wherein the calculator of the abscissa $a_i$ and ordinate $b_i$ interpolation points for the AM-AM characteristic is configured to resolve the equation:

$$b_i = \|\hat{g}(a_i)\| = \sum_{k=0}^{n} cA_k p_k(a_i),$$

and/or the calculator of the abscissa $c_i$ and ordinate $d_i$ interpolation points for the AM-PM characteristic is configured to resolve the equation:

$$d_i = \text{angle}(\hat{g}(c_i)) = \sum_{k=0}^{n} c\varphi_k p_k(c_i).$$

21. The device according to claim 17, wherein the calculator of the orthonormal base is configured to implement a Gram-Schmidt orthonormalisation of a base $\{1, x, x^*x^2, xx^*, \ldots\}$ and the calculator of the nonlinearities approximation is configured to resolve the equation:

$$g(\|x\|) = \|g(\|x\|)\| \exp(j \cdot \text{angle}(g(\|x\|)))$$

$$= \left(\sum_{k=0}^{n} cA_k p_k(\|x\|)\right) \exp\left(j * \left(\sum_{k=0}^{n} c\varphi_k p_k(\|x\|)\right)\right).$$

22. The devices according to claim 16, wherein the compensator comprises at least:

a compensator configured to compensate the AM-AM characteristic from an interpolating polynomial obtained from abscissa $a_i$ and ordinate $b_i$ interpolation points calculated previously, and/or a compensator configured to compensate the AM-PM characteristic by subtracting a phase distortion evaluated at a received signal phase.

23. The device according to claim 22, wherein the compensator of the AM-AM characteristic is configured to calculate the signal:

$$s_3'(t) = \sum_{j=1}^{m} a_j \prod_{i \neq j} \frac{\|s_2(t)\| - b_i}{b_j - b_i} \exp(j \cdot \text{angle}(s_2(t)))$$

with $s_2(t)$ as the signal received, $\|s_2(t)\|$ as a received signal module, $\text{angle}(s_2(t))$ as a received signal phase, m as a number of interpolation points, $(a_i, b_i)$ as the coordinates of the interpolation points, and the interpolating polynomial is a Lagrange polynomial, and/or the compensator of the AM-PM characteristic is configured to calculate the signal:

$$s_3(t) = s_3'(t) \cdot \exp(-j * \text{angle}(\hat{g}(|s_3'|))),$$

$s_3(t)$ is a nonlinearities compensated received signal.

24. The method according to claim 16, wherein the compensator of the nonlinearities is configured to implement a joint compensation of the AM-AM and AM-PM characteristics from a complex interpolating polynomial by calculating the signal:

$$s_3(t) = \sum_{j=1}^{m} a_j \prod_{i \neq j} \frac{s2(t) - b_i}{b_j - b_i}$$

with $s_2(t)$ as the signal received, $s_3(t)$ as a nonlinearities compensated received signal, $a_i$ and $b_i$ as abscissas and ordinates respectively of m interpolation points calculated previously.

25. The device according to claim 16, further comprising at least one transmission channel characteristic estimator configured to estimate a characteristic of the transmission channel from at least one other learning sequence transmitted through the transmission channel.

26. The device according to claim 25, wherein the estimated transmission channel characteristic is taken into account by the nonlinearities estimator.

27. The device according to claim 25, further comprising at least one equaliser configured to compensate for channel noise present in the received signal from the estimated transmission channel characteristic.

28. The device according to claim 16, further comprising a fast Fourier transform (FFT) configured to implement an FFT on the signal and/or at least one learning sequence received.

29. The device according to claim 16, wherein said receiver device is a wireless base station.

* * * * *